(12) United States Patent
Wang

(10) Patent No.: US 7,397,267 B2
(45) Date of Patent: Jul. 8, 2008

(54) VOLTAGE DETECTING CIRCUIT

(75) Inventor: Ting-Kai Wang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 73 days.

(21) Appl. No.: 11/518,793

(22) Filed: Sep. 11, 2006

(65) Prior Publication Data

US 2007/0096719 A1 May 3, 2007

(30) Foreign Application Priority Data

Oct. 17, 2005 (CN) .................. 2005 1 0100551

(51) Int. Cl.
G01R 31/26 (2006.01)

(52) U.S. Cl. .................................... 324/771
(58) Field of Classification Search ................ 324/133, 324/158.1, 765, 763, 556, 542; 340/660–664
See application file for complete search history.

(56) References Cited

U.S. PATENT DOCUMENTS 4,618,857 A * 10/1986 Dubois et al. ............... 340/654
4,879,625 A * 11/1989 Potenzone ................... 361/90
4,983,955 A * 1/1991 Ham et al. ................... 340/664
6,944,003 B2 9/2005 Sugimoto et al.
6,972,703 B1 12/2005 Yen et al.
6,980,449 B2 12/2005 Chang

* cited by examiner

Primary Examiner—Ha Tran Nguyen
Assistant Examiner—Tung X. Nguyen
(74) Attorney, Agent, or Firm—Morris Manning Martin LLP; Tim Tingkang Xia, Esq.

(57) ABSTRACT

A power supply voltage detecting circuit includes a voltage regulating circuit, a comparative circuit, a timer circuit, and a display circuit. The voltage regulating circuit provides a stable reference voltage to the comparative circuit. The comparative circuit compares the reference voltage with the voltage from the power supply. The comparative circuit is electrically connected to the display circuit via the timer circuit. The display circuit includes light emitting diodes for revealing a status of the voltage from the power supply. The timer circuit causes the display circuit to keep a light on when there has been an occurrence of abnormal voltage from the power supply until an operator resets it.

13 Claims, 1 Drawing Sheet

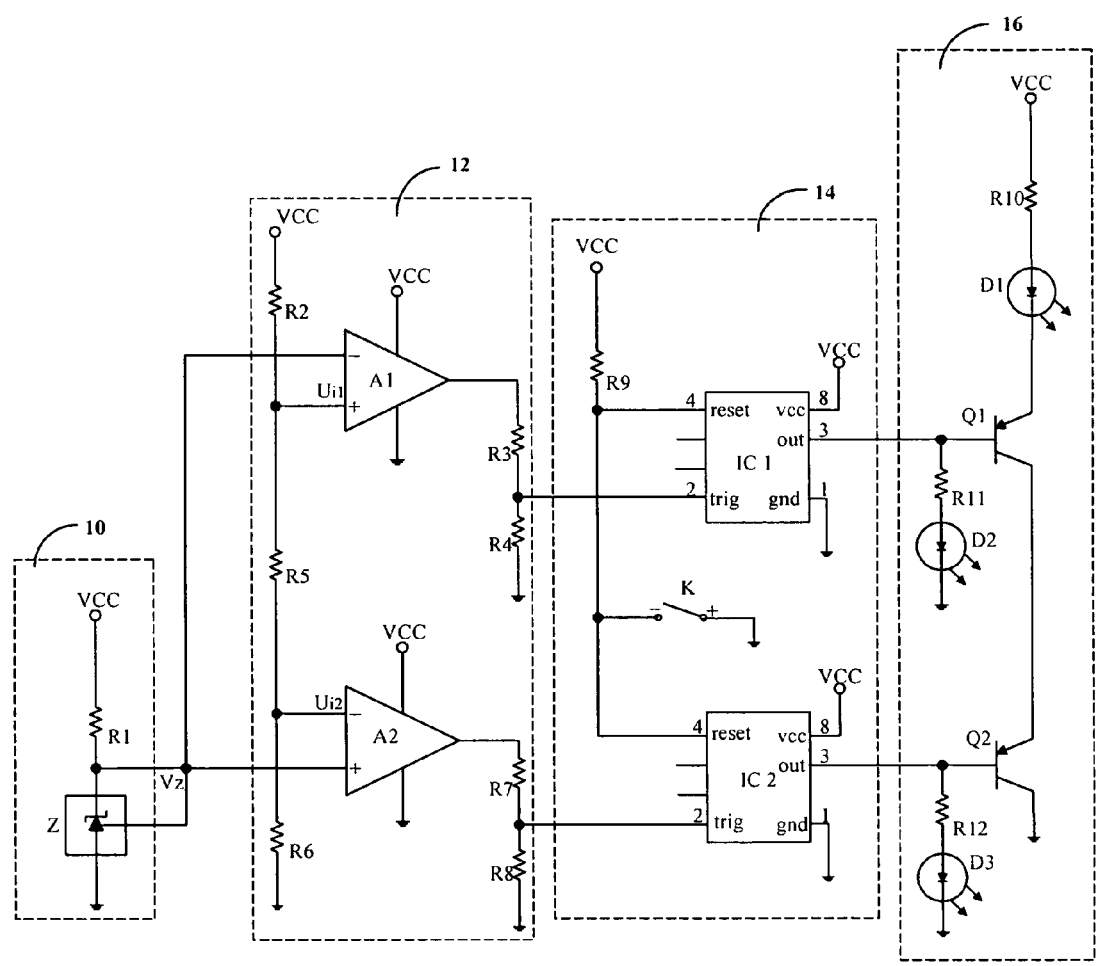

VOLTAGE DETECTING CIRCUIT

BACKGROUND

1. Field of the Invention

The present invention relates to a voltage detecting circuit, and more particularly to a voltage detecting circuit for detecting when voltage from a power supply falls outside of predetermined parameters.

2. General Background

With the increasing development of technology, computers have become essential electrical appliances in our lives. In addition, reliable and stable power supplies are essential to the computers.

To ensure quality performance of computers, testing the stability of power supplies in providing direct current (DC) voltages to a motherboard is needed in the manufacturing process. Each voltage requirement of the motherboard must be fulfilled within a determined range or tolerance. For example, if a 5V voltage is needed for providing power to a USB interface, the specifications may require that the voltage supplied be between 4.75V and 5.25V.

A typical voltage detecting circuit for testing voltages output by a power supply includes a voltage comparator for comparing the output of the power supply with a reference voltage, and a light emitting diode (LED) for indicating when the output voltage is not to specification.

However, the typical voltage detecting circuit does not indicate if the output voltage is greater than or lower than a specified range. In addition, the LED emits light only at the moment the abnormal voltage occurs and goes out when the voltage returns to the normal state. Therefore, an operator may overlook the transient occurrence and may not realize there is a fault needed to investigate.

What is needed is a voltage detecting circuit for detecting when voltage of a DC power supply is outside of specifications and alerting an operator to that fact even when it is a temporary or short term occurrence.

SUMMARY

An exemplary power supply voltage detecting circuit includes a voltage regulating circuit, a comparative circuit, a timer circuit, and a display circuit. The voltage regulating circuit provides a stable reference voltage to the comparative circuit. The comparative circuit compares the reference voltage with the voltage from the power supply. The comparative circuit is electrically connected to the display circuit via the timer circuit. The display circuit includes light emitting diodes for revealing a status of the voltage from the power supply. The timer circuit causes the display circuit to keep a light on when there has been an occurrence of abnormal voltage from the power supply until an operator resets it.

Other advantages and novel features will become more apparent from the following detailed description when taken in conjunction with the accompanying drawings, in which:

BRIEF DESCRIPTION OF THE DRAWINGS

The drawing is a circuit diagram of a voltage detecting circuit in accordance with a preferred embodiment of the present invention.

DETAILED DESCRIPTION OF THE EMBODIMENT

Referring to the drawing, a voltage detecting circuit of a preferred embodiment of the present invention includes a voltage regulating circuit 10, a comparative circuit 12, a timer circuit 14, and a display circuit 16. The regulating circuit 10 provides a stable reference voltage Vz to the comparative circuit 12. The comparative circuit 12 is electrically connected with the display circuit 16 via the timer circuit 14. The comparative circuit 12 compares voltage from a power supply and the display circuit 16 displays the status of the voltage from the power supply. In the exemplary embodiment, the voltage from the power supply is a system voltage VCC which should ideally be equal to 5V for providing power to a USB interface of a motherboard. According to known specifications, value of the voltage VCC may vary but should not be greater than 5.25V, or less than 4.75V.

The voltage regulating circuit 10 includes an adjustable Zener shunt regulator Z and a resistor R1. An anode of the regulator Z is grounded. A cathode of the regulator Z is connected to the system voltage VCC via the resistor R1, and the reference is tapped according to desired value of the reference voltage. Therefore, a stable reference voltage Vz is generated at the cathode of the regulator Z.

The comparative circuit 12 includes a first comparator or operational amplifier (op-amp) A1, and a second comparator or op-amp A2. A voltage comparator for comparing a voltage with upper/lower voltage limits is predetermined according to the first and second op-amps A1, A2 selected. Working voltages of both the first and the second op-amps A1, A2 are supplied by the system voltage VCC. A negative input of the first op-amp A1 and a positive input of the second op-amp A2 are both connected to the cathode of the regulator Z for the reference voltage. A positive input of the first op-amp A1 is coupled to the VCC via a resistor R2. Resistors R3 and R4 form a voltage divider between an output of the first op-amp A1 and ground. A negative input of the second op-amp A2 is connected to the positive input of the first op-amp A1 via a resistor R5, and is grounded via a resistor R6 as well. Resistors R7 and R8 form a voltage divider between an output of the second op-amp A2 and ground.

The timer circuit 14 includes a first timer integrated circuit (IC) 1, a second timer IC 2, and a reset switch K. In the preferred embodiment of the present invention, the ICs 1, 2 are 555 timer ICs. Power pins 8 of ICs 1, 2 are connected to VCC, and earth pins 1 of the ICs 1, 2 are grounded. A reset pin 4 of the IC 1 is coupled to VCC via a resistor R9. A trigger pin 2 of the IC 1 is connected to a node between the resistors R3 and R4. A reset pin 4 of the IC 2 is connected to the reset pin 4 of the IC 1, and is grounded via the reset switch K. A trigger pin 2 of the IC 2 is connected to a node between the resistors R7 and R8. Output pins 3 of the ICs 1, 2 are connected to the display circuit 16.

The display circuit 16 includes a first indicator like a first LED D1, a first bipolar junction transistor (BJT) Q1, a second indicator like a second LED D2, a second BJT Q2, and a third indicator like a third LED D3. An anode of the first LED D1 is connected to VCC via a resistor R10. A cathode of the first LED D1 is coupled to an emitter of the first BJT Q1. A base of the first BJT Q1 is connected to the output pin 3 of the IC 1. A collector of the first BJT Q1 is coupled to an emitter of the second BJT Q2. An anode of the second LED D2 is connected to the base of the first BJT Q1 via a resistor R11, and a cathode of the second LED D2 is grounded. A base of the second BJT Q2 is coupled to the output pin 3 of the IC 2. A collector of the second BJT Q2 is grounded. An anode of the third LED D3 is connected to the base of the second BJT Q2 via a resistor R12, and a cathode of the third LED D3 is grounded.

A working principle of the voltage detecting circuit is as follows: the system voltage VCC of approximately 5V is supplied for providing power to a USB interface. The comparative circuit 12 detects the voltage VCC. When supplied voltage is normal, that is the supply voltage is within upper and lower limits, the first LED D1 will emit light. However, if at any time the supply voltage is greater than the upper limit value or lower than the lower limit value predetermined by the specifications, the first LED D1 turns off and either LED D2 or LED D3 will light. The LED D2 lights up when the supply voltage has fallen below the lower limit and the LED D3 lights up when the supply voltage has gone above the upper limit. The timer circuit 14 is used to keep the second LED D2 and/or the third LED D3 lit until the timer circuit 14 is reset.

A working process of the voltage detecting circuit is as follows: when the supply voltage is within the desired limits, an input voltage Ui1 of the positive input of the first op-amp A1 is greater than the reference voltage Vz, and an input voltage Ui2 of the negative input of the second op-amp A2 is lower than the reference voltage Vz, both the outputs of the first op-amp A1 and the second op-amp A2 are then high levels. According to a voltage divider formula:

$$Ui1=((R5+R6)/Rt)*VCC; Ui2=(R6/Rt)*VCC$$

Wherein, Rt=R2+R5+R6. Therefore, when ((R5+R6)/Rt)*VCC>Vz and Ui2=(R6/Rt)*VCC<Vz, then both the outputs of the op-amps A1 and A2 are high. Therefore, both the trigger pins 2 of the ICs 1, 2 are high. Both the output pins 4 of the ICs 1, 2 are low. Therefore, the first BJT Q1 and the second BJT Q2 are both turned on. Thus the first LED D1 is lit.

When the supply voltage is below the lower limit, the input voltage Ui1 of the positive input of the first op-amp A1 is lower than the reference voltage Vz, that is, ((R5+R6)/Rt)*VCC<Vz, then the output of the first op-amp A1 is low, the output of the second op-amp A2 is high. Therefore, the output of the IC 1 is high, and the output of the IC 2 is low. Therefore, the second LED D2 emits light. At the same time, the first BJT Q1 is turned off, and the first LED D1 is turned off as well. The second LED D2 is kept lit by the IC 1 until the reset switch K is shut by an operator. As we know, the voltage VCC has a normal rise time at the beginning of work. To avoid erroneous error detecting, the reset switch K is shut by operators a short time after starting up, then is opened again for normal error detecting.

When the supply voltage is above the upper limit, the input voltage Ui2 of the negative input of the second op-amp A2 is greater than the reference voltage Vz, that is, (R6/Rt)*VCC>Vz, then the output of the second op-amp A2 is low. Therefore, the output of the IC 2 is high. The third LED D3 emits light, the second BJT Q2 is turned off, and the first LED D1 is turned off as well. Also, the third LED D3 is kept lit by the IC 2 until the reset switch K is shut by the operator.

In the embodiment, appropriate resistors were chosen so that the reference voltages were equal to the upper and lower limits of the known specification, in this case the lower limit was 4.75V and the upper limit was 5.25V and the ideal value of VCC being expressed as follows; lower limit<VCC<upper limit. In addition, each of the control pins of the ICs 1, 2 of the timer circuit 14 may be connected to by-pass capacitors consecutively for greater stabilization of the circuit if needed.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A voltage detecting circuit, comprising:
   a comparative circuit for comparing a reference voltage with a voltage from a power supply;
   a voltage regulating circuit for providing the reference voltage to the comparative circuit;
   a display circuit for revealing a status of the voltage from the power supply; and
   a timer circuit electrically connected between the comparative circuit and the display circuit to cause the display circuit to maintain a status display when there has been an occurrence of abnormal voltage from the power supply, wherein the comparative circuit comprises a first operational amplifier and a second operational amplifier, both a negative input of the first operational amplifier and a positive input of the second operational amplifier receiving the reference voltage; a positive input of the first operational amplifier receiving the voltage from the power supply via a first resistor; a negative input of the second operational amplifier connected in series with a second resistor connected to the positive input of the first operational amplifier, and grounded via a third resistor.

2. The voltage detecting circuit as claimed in claim 1, wherein the timer circuit comprises a first timer integrated circuit, a second timer integrated circuit, and a reset switch; reset pins of the first and the second timer integrated circuit are connected to the reset switch, an input terminal of the first timer integrated circuit is connected to an output of the first operational amplifier, and an input terminal of the second timer integrated circuit connected to an output of the second operational amplifier.

3. The voltage detecting circuit as claimed in claim 2, wherein the display circuit comprises a first LED, a first transistor, a second LED, a second transistor, and a third LED; an anode of the first LED is connected to the voltage from the power supply, a cathode of the first LED is connected to an emitter of the first transistor; a base of the first transistor is connected to the output of the first timer integrated circuit, a collector of the first transistor is coupled to an emitter of the second transistor, an anode of the second LED is connected to the base of the first transistor, and a cathode of the second LED is grounded; a base of the second transistor is coupled to the output of the second timer integrated circuit, a collector of the second transistor is grounded; an anode of the third LED is connected to the base of the second transistor, and a cathode of the third LED is grounded.

4. The voltage detecting circuit as claimed in claim 3, wherein the voltage regulating circuit comprises a Zener shunt regulator, an anode of the regulator is grounded, a cathode of the regulator is connected to the voltage from the power supply, and the reference is tapped according to desired value of the reference voltage.

5. The voltage detecting circuit as claimed in claim 3, wherein the second LED and the third LED indicate the abnormal states of the power voltage.

6. The voltage detecting circuit as claimed in claim 3, wherein the first transistor and the second transistor are Bipolar Junction Transistors (BJTs).

7. A voltage detecting circuit for detecting and indicating when voltage of a DC power supply is in an abnormal state, the voltage detecting circuit comprising:
   a voltage comparator formed by a first operational amplifier and a second operational amplifier, a positive input of the first operational amplifier connected to the voltage from a power supply via a first resistor; a negative input of the second operational amplifier in series with a second resistor connected to the positive input of the first operational amplifier; the negative input of the second operational amplifier grounded via a third resistor as well;

a Zener shunt regulator for generating a stable reference voltage for the voltage comparator, an anode of the regulator grounded, a cathode of the regulator connected to the voltage from the power supply, both a negative input of the first operational amplifier and a positive input of the second operational amplifier connected to the stable reference voltage;

a display circuit for revealing a states of the voltage from the power supply; and a timer circuit electrically connected between the voltage comparator and the display circuit to cause the display circuit to maintain a status display when there has been an occurrence of abnormal voltage from the power supply.

8. The voltage detecting circuit as claimed in claim 7, wherein the timer circuit comprises a first timer integrated circuit, a second timer integrated circuit, and a reset switch; reset pins of the first timer integrated circuit and the second timer integrated circuit are connected to the reset switch, an input terminal of the first timer integrated circuit is connected to an output of the first operational amplifier, and an input terminal of the second timer integrated circuit is connected to an output of the second operational amplifier.

9. The voltage detecting circuit as claimed in claim 8, wherein the display circuit comprises a first LED, a first transistor, a second LED, a second transistor, and a third LED; an anode of the first LED is connected to the power supply, a cathode of the first LED is connected to an emitter of the first transistor; a base of the first transistor is connected to the output of the first timer integrated circuit, a collector of the first transistor is coupled to an emitter of the second transistor, an anode of the second LED is connected to the base of the first transistor, and a cathode of the second LED is grounded; a base of the second transistor is coupled to the output of the second timer integrated circuit, a collector of the second transistor is grounded; an anode of the third LED is connected to the base of the second transistor, and a cathode of the third LED is grounded.

10. The voltage detecting circuit as claimed in claim 9, wherein the second LED and the third LED indicate the abnormal states of the voltage from the power supply.

11. The voltage detecting circuit as claimed in claim 10, wherein the first transistor and the second transistor are Bipolar Junction Transistors (BJTs).

12. A circuit for detecting voltage of a power supply, comprising:

a voltage regulating circuit for providing a reference voltage to be in comparison therewith;

a comparative circuit electrically connectable with said voltage regulating circuit and with a power supply so as to input said reference voltage from said voltage regulating circuit and a power voltage to be detected from said power supply for comparison, said comparative circuit comprising a first comparator and a second comparator to electrically connect with said voltage regulating circuit for respectively retrieving two different voltage inputs out of said power voltage so as to generate at least three different comparative outputs, a positive input of said first comparator electrically connectable with said power supply via a first resistor; a negative input of said second comparator in series with a second resistor electrically connectable to said positive input of said first comparator; said negative input of said second comparator grounded via a third resistor; and a display circuit electrically connectable with said comparative circuit for indicating a corresponding status of said power voltage of said power supply based on said at least three comparative outputs of said comparative circuit.

13. The circuit as claimed in claim 12, further comprising a timer circuit electrically connectable between said comparative circuit and said display circuit to maintain indication of said display circuit.

* * * * *